United States Patent
Terauchi et al.

(10) Patent No.: US 9,831,096 B2
(45) Date of Patent: Nov. 28, 2017

(54) PLASMA PROCESSING METHOD AND PLASMA PROCESSING APPARATUS

(71) Applicant: Hitachi High-Technologies Corporation, Tokyo (JP)

(72) Inventors: Hiromitsu Terauchi, Tokyo (JP); Tsutomu Iida, Tokyo (JP); Yuuzou Oohirabaru, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/995,637

(22) Filed: Jan. 14, 2016

(65) Prior Publication Data
US 2016/0211153 A1 Jul. 21, 2016

(30) Foreign Application Priority Data

Jan. 19, 2015 (JP) .................................. 2015-007363

(51) Int. Cl.
*H01L 21/67* (2006.01)
*H01J 37/32* (2006.01)
*H01L 21/3065* (2006.01)

(52) U.S. Cl.
CPC ........ *H01L 21/3065* (2013.01); *H01J 37/321* (2013.01); *H01J 37/32146* (2013.01); *H01J 37/32174* (2013.01); *H01J 37/32568* (2013.01); *H01J 37/32577* (2013.01); *H01J 37/32715* (2013.01)

(58) Field of Classification Search
None
See application file for complete search history.

(56) References Cited

U.S. PATENT DOCUMENTS

| | | | | |
|---|---|---|---|---|
| 5,562,952 | A * | 10/1996 | Nakahigashi | C23C 16/405 118/50 |
| 7,842,355 | B2 * | 11/2010 | Stowell | C23C 16/029 427/248.1 |
| 9,451,687 | B2 * | 9/2016 | Yuzurihara | H05H 1/46 |
| 2001/0031542 | A1 * | 10/2001 | Ito | C23C 16/24 438/482 |

(Continued)

FOREIGN PATENT DOCUMENTS

JP    2004-079600 A    3/2004

*Primary Examiner* — Allan Olsen
(74) *Attorney, Agent, or Firm* — Mattingly & Malur, PC

(57) ABSTRACT

A plasma processing method including disposing a wafer to be processed on a sample stage disposed in a processing chamber within a vacuum vessel, supplying an electric field using first high frequency power for plasma forming into the processing chamber and forming plasma, and supplying second high frequency power for bias potential forming to electrodes disposed within the sample stage and processing a film on a top surface of the wafer. At least the first or second high frequency power repeats a change of becoming a plurality of predetermined amplitudes for predetermined periods with a predetermined repetition period. In the processing of the film, supply of the high frequency power is changed by finally increasing a predetermined magnitude of amplitude among the repetition period, ratio of the period, and amplitude of the at least the first or second high frequency power, or first decreasing a predetermined magnitude of the amplitude.

4 Claims, 14 Drawing Sheets

(56) References Cited

U.S. PATENT DOCUMENTS

| | | | |
|---|---|---|---|
| 2003/0201256 A1* | 10/2003 | Tauchi | H01J 37/32082 219/121.42 |
| 2004/0031566 A1* | 2/2004 | Takahashi | H01J 37/32935 156/345.35 |
| 2011/0032047 A1* | 2/2011 | Yuzurihara | H01J 37/32082 332/108 |
| 2014/0057445 A1* | 2/2014 | Morimoto | H01L 21/3065 438/710 |
| 2015/0170886 A1* | 6/2015 | Morimoto | H01J 37/32128 156/345.24 |
| 2015/0279624 A1* | 10/2015 | Toyota | H01J 37/32146 156/345.28 |
| 2015/0371876 A1* | 12/2015 | Terauchi | H01J 37/32183 438/710 |
| 2016/0203958 A1* | 7/2016 | Arase | H01J 37/32935 438/10 |
| 2016/0211153 A1* | 7/2016 | Terauchi | H01L 21/3065 |
| 2016/0254163 A1* | 9/2016 | Tamari | H01L 21/30655 438/714 |
| 2016/0284514 A1* | 9/2016 | Hirano | H01J 37/32091 |

* cited by examiner

FIG. 1

| | |
|---|---|
| 100 OUTPUT INTENSITY: BECOMES LOW DUTY RATIO: BECOMES HIGH PULSE FREQUENCY: BECOMES LOW | |
| 101 IDEAL CHANGEOVER OF PROCESSING STEP | |
| 102 CASE WHERE SETTING IS CHANGED OVER IN ORDER OF DUTY RATIO→OUTPUT INTENSITY→PULSE FREQUENCY | |
| 103 CASE WHERE SETTING IS CHANGED OVER IN ORDER OF DUTY RATIO→PULSE FREQUENCY→OUTPUT INTENSITY | |
| 104 CASE WHERE SETTING IS CHANGED OVER IN ORDER OF PULSE FREQUENCY→DUTY RATIO→OUTPUT INTENSITY | |
| 105 CASE WHERE SETTING IS CHANGED OVER IN ORDER OF PULSE FREQUENCY→OUTPUT INTENSITY→DUTY RATIO | |

FIG. 5

| CASE | OUTPUT INTENSITY | DUTY RATIO | PULSE FREQUENCY |
|---|---|---|---|
| 600 | BECOMES HIGH | BECOMES HIGH | BECOMES HIGH |
| 700 | | | BECOMES LOW |
| 800 | | BECOMES LOW | BECOMES HIGH |
| 900 | | | BECOMES LOW |
| 1000 | BECOMES LOW | BECOMES HIGH | BECOMES HIGH |
| 1100 | | | BECOMES LOW |
| 1200 | | BECOMES LOW | BECOMES HIGH |
| 1300 | | | BECOMES LOW |

FIG. 6

| 600 OUTPUT INTENSITY: BECOMES HIGH DUTY RATIO: BECOMES HIGH PULSE FREQUENCY: BECOMES HIGH | | | | |
|---|---|---|---|---|
| 601 IDEAL CHANGEOVER OF PROCESSING STEP | | | | |
| 602 CASE WHERE SETTING IS CHANGED OVER IN ORDER OF OUTPUT INTENSITY→DUTY RATIO→PULSE FREQUENCY | | | | |
| 603 CASE WHERE SETTING IS CHANGED OVER IN ORDER OF OUTPUT INTENSITY→PULSE FREQUENCY→DUTY RATIO | | | | |
| 604 CASE WHERE SETTING IS CHANGED OVER IN ORDER OF DUTY RATIO→OUTPUT INTENSITY→PULSE FREQUENCY | | | | |
| 605 CASE WHERE SETTING IS CHANGED OVER IN ORDER OF DUTY RATIO→PULSE FREQUENCY→OUTPUT INTENSITY | | | | |
| 606 CASE WHERE SETTING IS CHANGED OVER IN ORDER OF PULSE FREQUENCY→OUTPUT INTENSITY→DUTY RATIO | | | | |
| 607 CASE WHERE SETTING IS CHANGED OVER IN ORDER OF PULSE FREQUENCY→DUTY RATIO→OUTPUT INTENSITY ACCORDING TO FLOWCHARTS IN FIGS. 3 AND 4 | | | | |

FIG. 7

| | | |
|---|---|---|
| 701 | IDEAL CHANGEOVER OF PROCESSING STEP | |
| 702 | CASE WHERE SETTING IS CHANGED OVER IN ORDER OF OUTPUT INTENSITY→DUTY RATIO→PULSE FREQUENCY | |
| 703 | CASE WHERE SETTING IS CHANGED OVER IN ORDER OF OUTPUT INTENSITY→PULSE FREQUENCY→DUTY RATIO | |
| 704 | CASE WHERE SETTING IS CHANGED OVER IN ORDER OF DUTY RATIO→OUTPUT INTENSITY→PULSE FREQUENCY | |
| 705 | CASE WHERE SETTING IS CHANGED OVER IN ORDER OF DUTY RATIO→PULSE FREQUENCY→OUTPUT INTENSITY | |
| 706 | CASE WHERE SETTING IS CHANGED OVER IN ORDER OF PULSE FREQUENCY→OUTPUT INTENSITY→DUTY RATIO | |
| 707 | CASE WHERE SETTING IS CHANGED OVER IN ORDER OF PULSE FREQUENCY→DUTY RATIO→OUTPUT INTENSITY ACCORDING TO FLOWCHARTS IN FIGS. 3 AND 4 | |

700
OUTPUT INTENSITY: BECOMES HIGH
DUTY RATIO: BECOMES HIGH
PULSE FREQUENCY: BECOMES LOW

FIG. 8

| | | |
|---|---|---|
| 800<br>OUTPUT INTENSITY: BECOMES HIGH<br>DUTY RATIO: BECOMES LOW<br>PULSE FREQUENCY: BECOMES HIGH | 801 | IDEAL CHANGEOVER OF PROCESSING STEP |
| | 802 | CASE WHERE SETTING IS CHANGED OVER IN ORDER OF OUTPUT INTENSITY ⇒ DUTY RATIO ⇒ PULSE FREQUENCY |
| | 803 | CASE WHERE SETTING IS CHANGED OVER IN ORDER OF OUTPUT INTENSITY ⇒ PULSE FREQUENCY ⇒ DUTY RATIO |
| | 804 | CASE WHERE SETTING IS CHANGED OVER IN ORDER OF PULSE FREQUENCY ⇒ OUTPUT INTENSITY ⇒ DUTY RATIO |
| | 805 | CASE WHERE SETTING IS CHANGED OVER IN ORDER OF PULSE FREQUENCY ⇒ DUTY RATIO ⇒ OUTPUT INTENSITY |
| | 806 | CASE WHERE SETTING IS CHANGED OVER IN ORDER OF DUTY RATIO ⇒ OUTPUT INTENSITY ⇒ PULSE FREQUENCY |
| | 807 | CASE WHERE SETTING IS CHANGED OVER IN ORDER OF DUTY RATIO ⇒ PULSE FREQUENCY ⇒ OUTPUT INTENSITY ACCORDING TO FLOWCHARTS IN FIGS. 3 AND 4 |

FIG. 9

| | | |
|---|---|---|
| 901 | IDEAL CHANGEOVER OF PROCESSING STEP | |
| 902 | CASE WHERE SETTING IS CHANGED OVER IN ORDER OF OUTPUT INTENSITY → DUTY RATIO → PULSE FREQUENCY | |
| 903 | CASE WHERE SETTING IS CHANGED OVER IN ORDER OF OUTPUT INTENSITY → PULSE FREQUENCY → DUTY RATIO | |
| 904 | CASE WHERE SETTING IS CHANGED OVER IN ORDER OF PULSE FREQUENCY → OUTPUT INTENSITY → DUTY RATIO | |
| 905 | CASE WHERE SETTING IS CHANGED OVER IN ORDER OF PULSE FREQUENCY → DUTY RATIO → OUTPUT INTENSITY | |
| 906 | CASE WHERE SETTING IS CHANGED OVER IN ORDER OF DUTY RATIO → OUTPUT INTENSITY → PULSE FREQUENCY | |
| 907 | CASE WHERE SETTING IS CHANGED OVER IN ORDER OF DUTY RATIO → PULSE FREQUENCY → OUTPUT INTENSITY ACCORDING TO FLOWCHARTS IN FIGS. 3 AND 4 | |

900
OUTPUT INTENSITY: BECOMES HIGH
DUTY RATIO: BECOMES LOW
PULSE FREQUENCY: BECOMES LOW

FIG. 10

| | | |
|---|---|---|
| 1001 | IDEAL CHANGEOVER OF PROCESSING STEP | |
| 1002 | CASE WHERE SETTING IS CHANGED OVER IN ORDER OF DUTY RATIO ⇒ OUTPUT INTENSITY ⇒ PULSE FREQUENCY | |
| 1003 | CASE WHERE SETTING IS CHANGED OVER IN ORDER OF DUTY RATIO ⇒ PULSE FREQUENCY ⇒ OUTPUT INTENSITY | |
| 1004 | CASE WHERE SETTING IS CHANGED OVER IN ORDER OF PULSE FREQUENCY ⇒ DUTY RATIO ⇒ OUTPUT INTENSITY | |
| 1005 | CASE WHERE SETTING IS CHANGED OVER IN ORDER OF PULSE FREQUENCY ⇒ OUTPUT INTENSITY ⇒ DUTY RATIO | |
| 1006 | CASE WHERE SETTING IS CHANGED OVER IN ORDER OF OUTPUT INTENSITY ⇒ DUTY RATIO ⇒ PULSE FREQUENCY | |
| 1007 | CASE WHERE SETTING IS CHANGED OVER IN ORDER OF OUTPUT INTENSITY ⇒ PULSE FREQUENCY ⇒ DUTY RATIO ACCORDING TO FLOWCHARTS IN FIGS. 3 AND 4 | |

1000
OUTPUT INTENSITY: BECOMES LOW
DUTY RATIO: BECOMES HIGH
PULSE FREQUENCY: BECOMES HIGH

FIG. 11

| 1100 OUTPUT INTENSITY: BECOMES LOW DUTY RATIO: BECOMES HIGH PULSE FREQUENCY: BECOMES LOW | | |
|---|---|---|
| 1101 | IDEAL CHANGEOVER OF PROCESSING STEP | |
| 1102 | CASE WHERE SETTING IS CHANGED OVER IN ORDER OF DUTY RATIO → OUTPUT INTENSITY → PULSE FREQUENCY | |
| 1103 | CASE WHERE SETTING IS CHANGED OVER IN ORDER OF DUTY RATIO → PULSE FREQUENCY → OUTPUT INTENSITY | |
| 1104 | CASE WHERE SETTING IS CHANGED OVER IN ORDER OF PULSE FREQUENCY → OUTPUT INTENSITY → DUTY RATIO | |
| 1105 | CASE WHERE SETTING IS CHANGED OVER IN ORDER OF PULSE FREQUENCY → DUTY RATIO → OUTPUT INTENSITY | |
| 1106 | CASE WHERE SETTING IS CHANGED OVER IN ORDER OF OUTPUT INTENSITY → DUTY RATIO → PULSE FREQUENCY | |
| 1107 | CASE WHERE SETTING IS CHANGED OVER IN ORDER OF OUTPUT INTENSITY → PULSE FREQUENCY → DUTY RATIO ACCORDING TO FLOWCHARTS IN FIGS. 3 AND 4 | |

FIG. 12

| 1200 OUTPUT INTENSITY: BECOMES LOW DUTY RATIO: BECOMES LOW PULSE FREQUENCY: BECOMES HIGH | | | |
|---|---|---|---|
| 1201 | IDEAL CHANGEOVER OF PROCESSING STEP | | |
| 1202 | CASE WHERE SETTING IS CHANGED OVER IN ORDER OF DUTY RATIO ⇒ OUTPUT INTENSITY ⇒ PULSE FREQUENCY | | |
| 1203 | CASE WHERE SETTING IS CHANGED OVER IN ORDER OF DUTY RATIO ⇒ PULSE FREQUENCY ⇒ OUTPUT INTENSITY | | |
| 1204 | CASE WHERE SETTING IS CHANGED OVER IN ORDER OF PULSE FREQUENCY ⇒ OUTPUT INTENSITY ⇒ DUTY RATIO | | |
| 1205 | CASE WHERE SETTING IS CHANGED OVER IN ORDER OF PULSE FREQUENCY ⇒ DUTY RATIO ⇒ OUTPUT INTENSITY | | |
| 1206 | CASE WHERE SETTING IS CHANGED OVER IN ORDER OF OUTPUT INTENSITY ⇒ PULSE FREQUENCY ⇒ DUTY RATIO | | |
| 1207 | CASE WHERE SETTING IS CHANGED OVER IN ORDER OF OUTPUT INTENSITY ⇒ DUTY RATIO ⇒ PULSE FREQUENCY ACCORDING TO FLOWCHARTS IN FIGS. 3 AND 4 | | |

FIG. 13

| | | |
|---|---|---|
| 1301 | IDEAL CHANGEOVER OF PROCESSING STEP | |
| 1302 | CASE WHERE SETTING IS CHANGED OVER IN ORDER OF DUTY RATIO → OUTPUT INTENSITY → PULSE FREQUENCY | |
| 1303 | CASE WHERE SETTING IS CHANGED OVER IN ORDER OF DUTY RATIO → PULSE FREQUENCY → OUTPUT INTENSITY | |
| 1304 | CASE WHERE SETTING IS CHANGED OVER IN ORDER OF PULSE FREQUENCY → OUTPUT INTENSITY → DUTY RATIO | |
| 1305 | CASE WHERE SETTING IS CHANGED OVER IN ORDER OF PULSE FREQUENCY → DUTY RATIO → OUTPUT INTENSITY | |
| 1306 | CASE WHERE SETTING IS CHANGED OVER IN ORDER OF OUTPUT INTENSITY → PULSE FREQUENCY → DUTY RATIO | |
| 1307 | CASE WHERE SETTING IS CHANGED OVER IN ORDER OF OUTPUT INTENSITY → DUTY RATIO → PULSE FREQUENCY ACCORDING TO FLOWCHARTS IN FIGS. 3 AND 4 | |

1300
OUTPUT INTENSITY: BECOMES LOW
DUTY RATIO: BECOMES LOW
PULSE FREQUENCY: BECOMES LOW

PLASMA PROCESSING METHOD AND PLASMA PROCESSING APPARATUS

BACKGROUND OF THE INVENTION

1. Field of the Invention

The present invention relates to a plasma processing device or a plasma processing method used to process a substrate-shaped sample such as a semiconductor wafer disposed in a processing chamber disposed within a vacuum vessel, by using plasma formed in the processing chamber. In particular, the present invention relates to a plasma processing device or a plasma processing method in which pulse-shaped output intensity, a duty ratio, and a pulse frequency of high frequency power for plasma forming or high frequency power for forming bias potential supplied to electrodes within a sample stage on which the sample is placed are changed over to different values.

2. Description of the Related Art

In the semiconductor manufacture process, dry etching processing is conducted to etch a film structure having a plurality of film layers including a mask layer formed by previously laminating on a top surface of a semiconductor wafer, by using plasma. A plasma processing device, which executes such processing, has the following configuration. That is, the plasma processing device forms plasma by supplying an electric field formed using high frequency power for plasma forming while introducing gas for processing into a processing chamber within a depressurized vacuum vessel. The plasma processing device supplies power from a different high frequency power supply to electrodes disposed in a sample stage within the processing chamber, and forms bias potential over a sample such as a semiconductor wafer placed and held on a top surface of the sample stage. The plasma processing device processes a target film in a film structure on a surface of the sample while attracting charged particles in the plasma to the surface of the sample in the plasma and causing the charged particles to collide with the surface of the sample. With advance of higher integration in semiconductor devices and three-dimensional structures in recent years, improvement of work precision is required of the plasma processing device conducting such dry etching and improvement of etching selection ratio or improvement of high precision control of the etching shape is required of the plasma processing device conducting such dry etching.

For executing such work, it is necessary to optimize a plurality of parameters such as an ion density at the time of etching processing, a radical density, energy of ions incident on a material to be etched, and a density and concentration of reaction products generated by etching reaction on a surface of the target film, in accordance with a material of a film to be processed. These parameters depend upon conditions under which etching processing is executed (such as, for example, a kind of gas, a pressure in processing in the processing chamber, a composition (mixture ratio) of gas including a plurality of elements, a value of the high frequency power for plasma forming, and a value of the high frequency power for bias forming).

In general, when conducting etching processing on at least one specific film, it is conducted to change over to suitable processing conditions every film layer or with the advance of processing even for a layer of the same material and execute processing. Such processing conditions are called recipe. In conventional etching processing of a film structure of a top surface of one sample in a plasma processing device, a plurality of different processing steps are executed consecutively under different processing conditions (recipes). Such processing conditions (recipes) are input to a controller in the plasma processing device as electronic or electric data or information. The controller adjusts operation of a vacuum processing device to implement recipes indicated by input information individually, change over a plurality of processing steps in order, and execute etching processing.

In recent years, a method for improving controllability of the ion density and radical density by pulsating the plasma generation to further optimize the etching processing conditions is proposed. In addition, in order to conduct etching of a high aspect ratio on a multi-layer film structure and a three-dimensional structure, improving the selection ratio by applying pulsated bias and using deposition effectively and suppressing damage by reducing the electronic shading effect are also proposed.

Therefore, a technique for executing processing by using a recipe that causes the high frequency power supply to conduct pulse output in a specific processing step is proposed. For example, if it is suitable to cause the high frequency power supply to conduct pulse output in processing of any material in a case where a multi-layer film including materials of two different is etched consecutively, a recipe that changes over alternately pulse outputs of two kinds is set and the recipe is transmitted to the controller via a communication means. The controller sends an instruction signal to regions in the plasma processing device in accordance with the recipe, and etching processing is conducted.

In such a recipe that changes over pulse output modes of two kinds, a shift from former one in two processing steps that are consecutive before and after to latter one is conducted. In a case where a deviation exceeding an allowable range occurs at the time of changeover of the output intensity, duty ratio, and pulse frequency in the shift, power is output with an output intensity that is longer than and higher than the setting value. Here, the duty ratio is a ratio of a period for which a value of a specific level (magnitude), especially a large value is output, to one repetition period of the pulse output.

FIG. 1 is a graph schematically illustrating an example of an output waveform of the high frequency power supply at the time of a shift between two processing steps respectively conducted before and after the shift while continuing a pulse output in the conventional technique. In FIG. 1, a shift between the processing steps is conducted to change over the output of the high frequency power supply from a pulse output of high output intensity, a low duty ratio, and a high pulse frequency to a pulse output of low output intensity, a high duty ratio, and a low pulse frequency.

In FIG. 1, reference numeral 101 illustrates an ideal shift of processing step in which the output intensity, duty ratio, and pulse frequency are changed over at the same time. Reference numerals 102 to 105 illustrate output waveforms at the time of a shift of processing step in a case where deviations occur in changeover instructions of the output intensity, duty ratio, and pulse frequency. As for causes of such occurrence of deviations in changeover instructions at the time of the shift of processing step, a difference in time constant between output control of the high frequency power supply and changeover of an external trigger pulse signal, a deviation in timing of an instruction from the controller to the high frequency power supply, and variations of delay times of relays, electronic components, and the like within the high frequency power supply are conceivable.

Comparing 102 to 105 in FIG. 1 with 101, a period of high output intensity becomes long in any output waveform. If high frequency power for plasma generation is applied with output intensity as illustrated I 102 to 105, plasma that is high in electron temperature and degree of dissociation is generated and it becomes impossible to maintain suitable ions and a suitable radical ratio. As a result, there is a fear that the etching speed will become low and the work shape will deteriorate. In the same way, if high frequency power for ion drawing bias application is applied with output intensity as illustrated in 102 to 105 in FIG. 1 in a state in which plasma is generated, there is a fear that the semiconductor wafer will be damaged by dielectric breakdown caused by the electron shading effect in addition to deterioration of the selection ratio.

As a conventional technique for controlling an output of the high frequency power supply at the time of such a shift of processing step, a technique disclosed in JP-2004-79600-A is known. The conventional technique prevents output of a continuous wave (CW) with intensity of setting or more from occurring by suitably controlling changeover instruction timing of output intensity and an output mode.

In the above-described conventional technique, the following points are not considered sufficiently and consequently problems occur.

That is, control on the changeover instruction timing of the output intensity and output mode in JP-2004-79600-A cope with only the time of changeover of the output mode. If high frequency power for plasma generation is applied in the output intensity when changeover to an output different in the output intensity, pulse frequency, and the duty ratio is conducted while the pulse output mode is continued as illustrated in FIG. 1, therefore, plasma that is high in electron temperature and degree of dissociation is generated, and suitable ions and a radical ratio. There is a fear that the etching speed will become lower and the work shape will deteriorate.

In addition, there is a fear that the selection ratio will deteriorate and the semiconductor wafer will be damaged by dielectric breakdown caused by the electron shading effect. A consequent problem that the yield of sample processing is hampered is not considered in the above-described conventional technique.

SUMMARY OF THE INVENTION

An object of the present invention is to provide a plasma processing device or a plasma processing method that improves the yield.

The above object is achieved by providing a plasma processing method including disposing a wafer to be processed on a sample stage disposed in a processing chamber within a vacuum vessel, supplying an electric field using first high frequency power for plasma forming into the processing chamber and forming plasma, and supplying second high frequency power for bias potential forming to electrodes disposed within the sample stage and processing a film on a top surface of the wafer, the plasma processing method including: causing at least either the first high frequency power or the second high frequency power to repeat a change of becoming a plurality of predetermined amplitudes for predetermined periods with a predetermined repetition period; and in the processing of the film, changing supply of the high frequency power by finally increasing a predetermined magnitude of amplitude among the repetition period, the ratio of the period, and amplitude of the at least either the first high frequency power or the second high frequency power, or first decreasing a predetermined magnitude of the amplitude.

According to the present invention, the high frequency power supply is controlled to prevent the high frequency power supply from outputting with output intensity that is longer and higher than a setting value when a shift of the processing step is conducted while continuing the pulse output mode. As a result, generation of plasma that is high in electron temperature and degree of dissociation is suppressed, damage to the semiconductor wafer is reduced, and the yield of processing is improved.

BRIEF DESCRIPTION OF THE DRAWINGS

FIG. 1 is a graph schematically illustrating an example of an output waveform of a high frequency power supply at the time of a shift between two processing steps respectively conducted before and after the shift while continuing a pulse output in a conventional technique;

FIG. 5 is a table illustrating case division in setting change of an output of a power supply at the time of a shift between two processing steps respectively conducted before and after the shift in the plasma processing device according to the first embodiment illustrated in FIG. 1;

FIG. 6 is a table illustrating output changes of the power supply in a case where all of the output intensity, duty ratio, and pulse frequency become high in a case 600 illustrated in FIG. 5;

FIG. 7 is a table illustrating output changes of the power supply in a case where the output intensity and the duty ratio become high and the pulse frequency becomes low in a case 700 illustrated in FIG. 5;

FIG. 8 is a table illustrating output changes of the power supply in a case where the output intensity and the pulse frequency become high and the duty ratio becomes low in a case 800 illustrated in FIG. 5;

FIG. 9 is a table illustrating output changes of the power supply in a case where the output intensity becomes high and the duty ratio and the pulse frequency become low in a case 900 illustrated in FIG. 5;

FIG. 10 is a table illustrating output changes of the power supply in a case where the output intensity becomes low and the duty ratio and the pulse frequency become high in a case 1000 illustrated in FIG. 5;

FIG. 11 is a table illustrating output changes of the power supply in a case where the output intensity and the pulse frequency become low and the duty ratio becomes high in a case 1100 illustrated in FIG. 5;

FIG. 12 is a table illustrating output changes of the power supply in a case where the output intensity and the duty ratio become low and the pulse frequency becomes high in a case 1200 illustrated in FIG. 5;

FIG. 13 is a table illustrating output changes of the power supply in a case where all of the output intensity, the pulse frequency and the duty ratio become low in a case 1300 illustrated in FIG. 5.

DESCRIPTION OF THE PREFERRED EMBODIMENTS

Hereafter, embodiments of the present invention will be described with reference to the drawings.

First Embodiment

Figure 2:
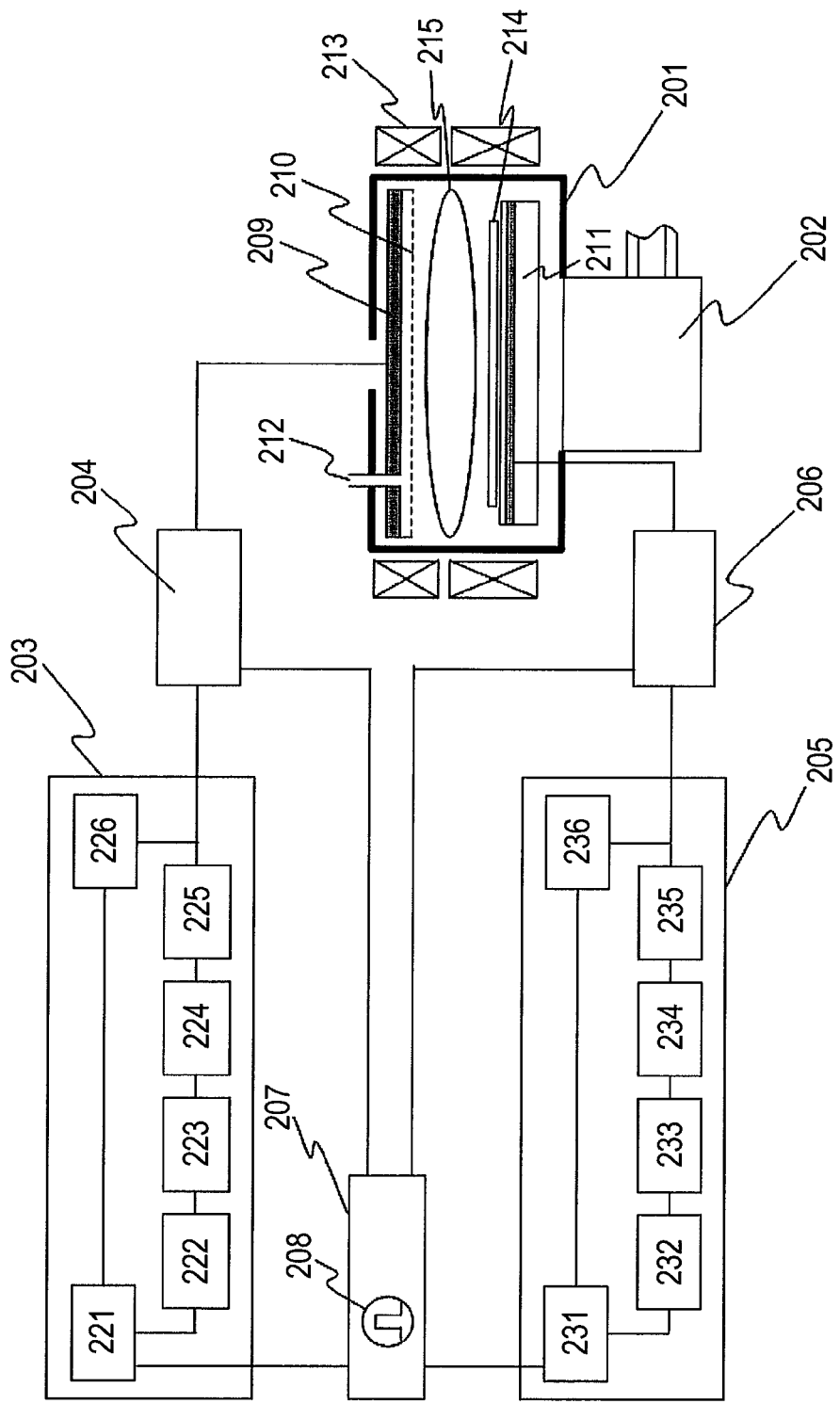
FIG. 2 is a longitudinal sectional view schematically illustrating an outline of a structure of a plasma processing device according to a first embodiment of the present invention.

A first embodiment of the present invention will now be described with reference to FIGS. 2 to 13. FIG. 2 is a longitudinal sectional view schematically illustrating an outline of a structure of a plasma processing device according to the first embodiment of the present invention.

The plasma processing device illustrated in FIG. 2 includes an etching processing chamber 201, which is a space disposed within a vacuum processing device. In addition, a turbo molecular pump 202 forming a vacuum pump, which evacuates inside of the etching processing chamber 201 and maintains and implements a predetermined degree of vacuum, is coupled to a lower portion of the vacuum vessel and disposed to communicate with the inside of the etching processing chamber 201.

A flat plate antenna 209 electrically connected to a source power supply 203 via a source matching device 204 is provided in an upper portion of the vacuum vessel surrounding the etching processing chamber 201. The source power supply 203 is connected by a coaxial cable to output high frequency power of a predetermined frequency (a frequency in a VHF band is used in the present example) for plasma formation. In addition, a processing table 211 taking a cylindrical shape is provided in a lower portion within the etching processing chamber 201. A wafer 214 to be processed is placed and held on a top surface of the processing table 211. An electrode member made of metal taking a shape of a circular plate or a cylinder disposed within the processing table 211 is electrically connected to an external bias power supply 205 by a coaxial cable in the same way via a bias matching device 206 disposed outside the vacuum vessel.

The source power supply 203 and the bias power supply 205 in the plasma processing device in the present example supply high frequency power of a predetermined frequency to electrodes in the flat plate antenna 209 and the processing table 211, respectively. Outputs of the source power supply 203 and the bias power supply 205 increase and decrease in amplitude in a pulse form. That is, the high frequency power changes to a plurality of amplitudes each having a predetermined magnitude. A period for which the high frequency power takes each of the amplitudes is predetermined. Such an amplitude change is repeated with a predetermined repetition period.

Especially in the present example, small amplitude among a plurality of amplitudes has a value of 0 or a value that can be regarded as 0 as compared with a value of large amplitude. A pulse-shaped change in which the high frequency power is ON for only a predetermined period with a predetermined repetition period is repeated. Hereafter, a frequency of repetition corresponding to the predetermined repetition period is referred to as pulse frequency, a ratio of an ON period to an OFF period or to the repetition period is referred to as duty ratio, and magnitude of amplitude in the ON period is referred to as output intensity.

Furthermore, the plasma processing device includes a controller 207 connected to the above-described respective units to be able to communicate therewith. The controller 207 receives outputs from detectors such as sensors provided to detect operations of the respective units and sends instruction signals to adjust operations of the respective units in accordance with received results. The output intensities, the output mode, and the pulse frequency and the duty ratio at the time of pulse output of the source power supply 203 and the bias power supply 205 are adjusted in accordance with instructions from the controller 207. The controller 207 in the present example includes a pulse generator 208 configured to generate a trigger signal according to the pulse frequency and duty ratio at the time of pulse output.

The source power supply 203 and the bias power supply 205 are configured to include controllers 221 and 231, oscillation units 222 and 232, distribution units 223 and 233, amplification units 224 and 234, synthesis units 225 and 235, and high frequency detection units 226 and 236, respectively. Upon receiving an instruction signal sent from the controller 207, in the source power supply 203 and the bias power supply 205, the controllers 221 and 231 control outputs to obtain outputs according to the instruction.

High frequencies output from the oscillation units 222 and 232 such as crystal oscillation circuits are branched in the distribution units 223 and 233, amplified in the amplification units 224 and 234, then synthesized in the synthesis units 225 and 235, and output from the source power supply 203 and the bias power supply 205. Output values detected in the high frequency detection units 226 and 236 are fed back to the controllers 221 and 231, and adjustment is conducted to obtain outputs according to the setting.

It takes time in the range of several ms to several tens ms to adjust outputs of the high frequency power by using such feedback circuits. Furthermore, the source power supply 203 and the bias power supply 205 in the present example have a function of outputting pulses in synchronism with the external trigger pulse signal having a pulse frequency of 100 Hz to 10 kHz and a duty ratio of 10 to 90% output from the pulse generator 208.

The cylinder-shaped etching processing chamber 201 is constituted by a conductive material such as aluminum and is grounded. An upper portion of the etching processing chamber 201 is covered by the circular flat plate antenna 209. Under the flat plate antenna 209, a disk-shaped shower plate 210 forming a ceiling surface of the etching processing chamber 201 is disposed. The shower plate 210 has a plurality of gas introduction ports 212 uniformly distributed and disposed on a lower surface to introduce gas for etching into the etching processing chamber 201 from above evenly in a radial direction and a circumference direction. In addition, in a lower portion of the inside, a cylinder-shaped processing table 211 is disposed with an axis thereof conformed to a center axis of a cylinder of the shower plate 210 or the etching processing chamber 201. A top surface of the processing table 211 is opposed to the shower plate 210.

In outside periphery of the vacuum vessel surrounding the etching processing chamber 201 in the present example, coils 213 configured to introduce a magnetic field into the etching processing chamber 201 is disposed surrounding the etching processing chamber 201. The coils 213 take a shape of a cylinder or a disk to be coaxial with the center axis of the etching processing chamber 201. A plurality of coils are wound uniformly in the circumference direction and disposed.

The wafer 214, which is an etching processing object, is processed in the following course. In a state in which the wafer 214 is disposed on the processing table 211, gas for etching processing flows in from the gas introduction ports 212. High frequency power is output from the source power supply 203 and applied to the flat plate antenna 209. As a result, a high frequency electric field is formed in the etching processing chamber 201.

In addition, a magnetic field formed by supplying a DC current to the coils 213 is supplied to the inside of the etching processing chamber 201. At this time, interaction between an electric field and a magnetic field is caused by the high frequency power. Atoms or molecules in the gas for processing are excited by electron cyclotron resonance (ECR). High density plasma 215 is generated over the processing table 211 within the etching processing chamber 201.

In this state, high frequency power from the bias power supply 205 is applied to the electrodes within the processing table 211. As a result, bias potential is formed according to a potential difference from plasma having predetermined potential over the top surface of the wafer 214. Charged particles such as ions in the plasma 215 are attracted toward the film structure of the top surface of the wafer 214 while energy of the charged particles is being controlled according to magnitude of a difference between the bias potential and the potential of the plasma. The charged particles collide with the film structure of the top surface of the wafer 214. As a result, chemical and physical actions between radicals (active species) formed in the plasma 215 and sticking to the surface of the film structure and a material of the film layer are promoted and etching processing is conducted.

Various parameters (such as gas kinds, gas pressure, mixture ratio of gases, output intensity of the source power supply 203, and output intensity of the bias power supply 205) are stored as a recipe previously summarizing a series of processing steps in a memory such as a RAM in the controller 207 or a storage device having an external recording device that is attachable and detachable such as a CD-ROM. Parameter values are stored every processing step and information concerning the processing condition is updated.

Figure 3:
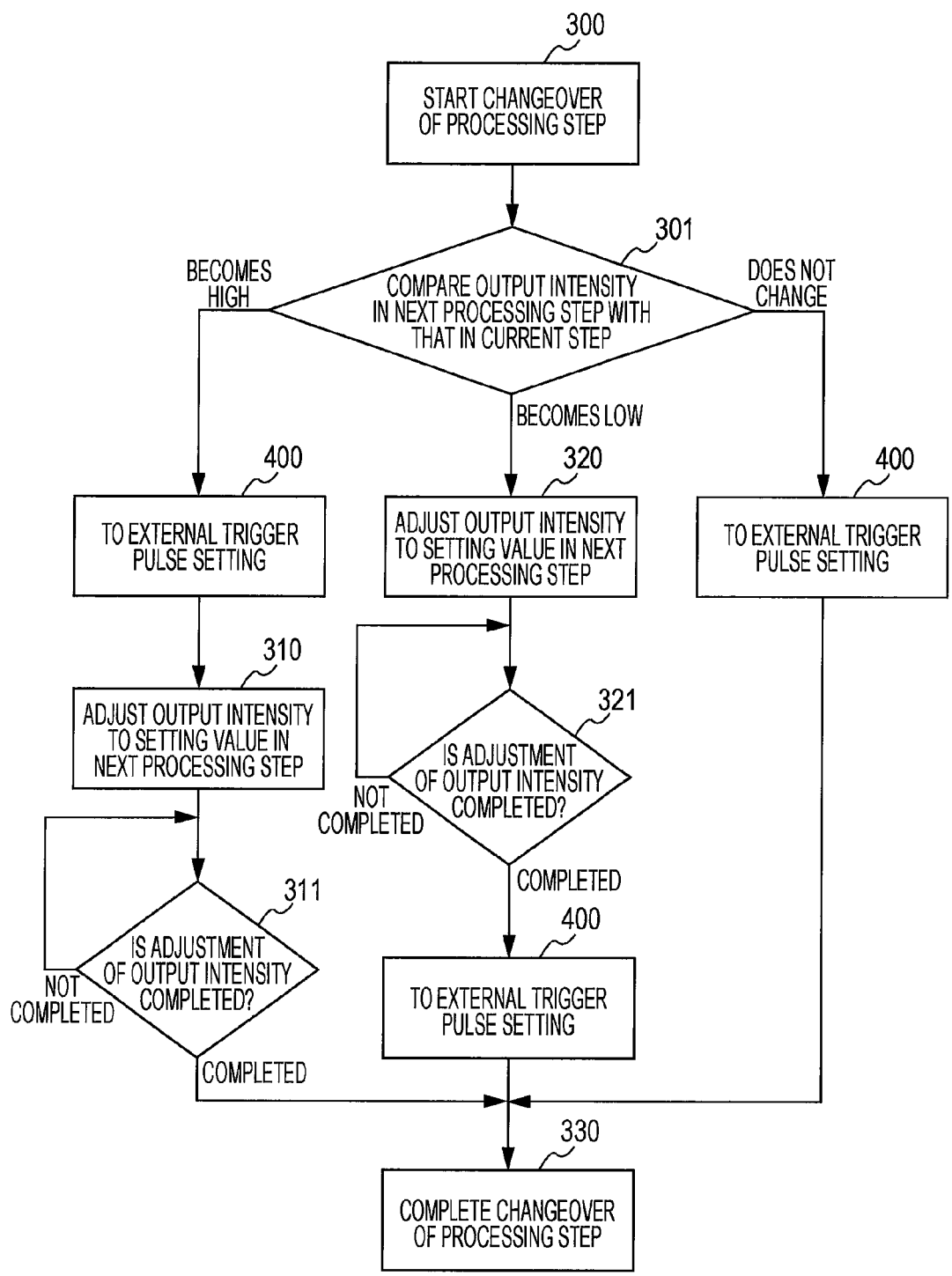
FIG. 3 is a flow chart illustrating a flow of operation at the time of a change of processing step in the plasma processing device according to the first embodiment illustrated in FIG. 1.
Figure 4:
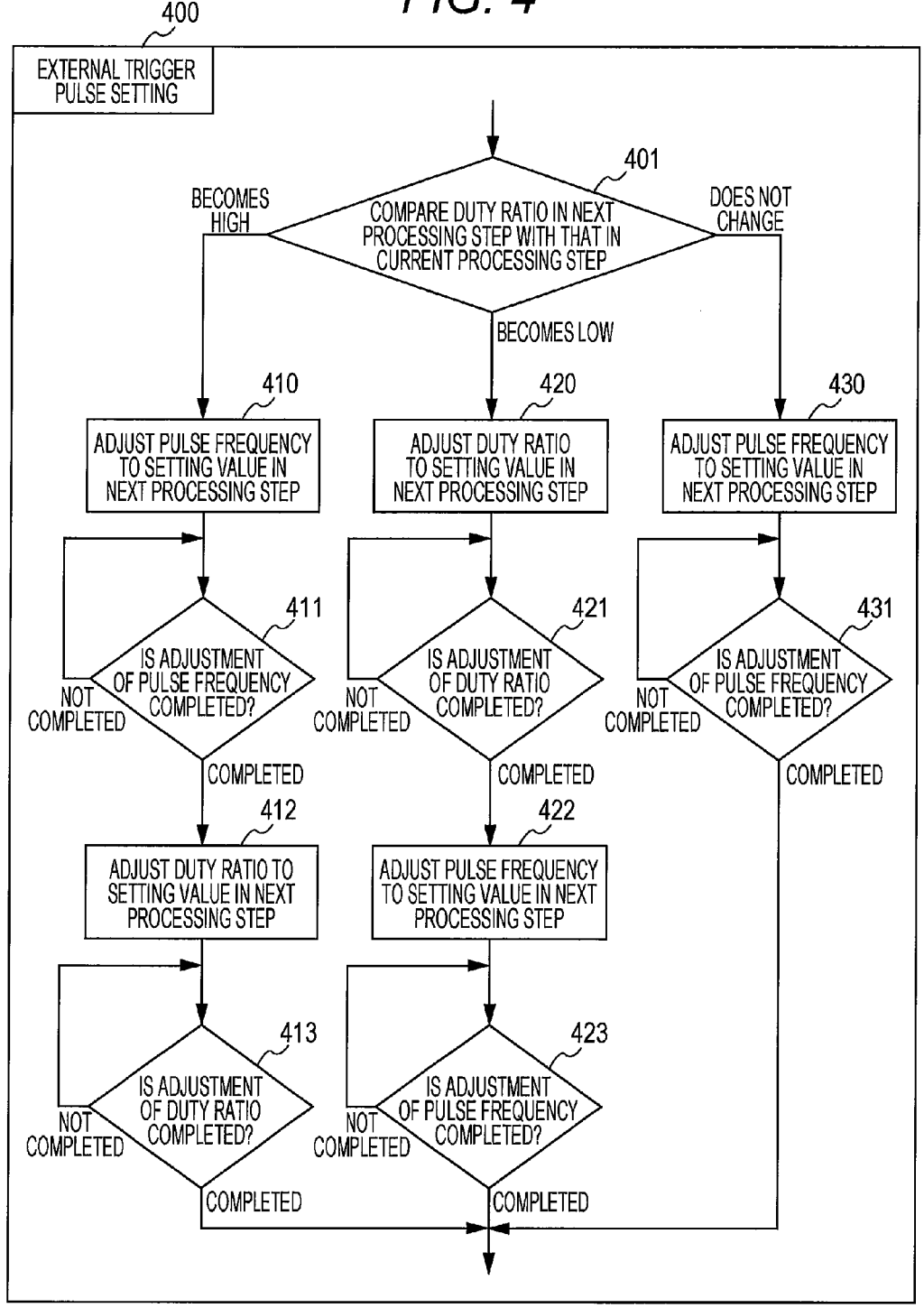
FIG. 4 is a flow chart illustrating a flow of operation of external trigger pulse setting in the plasma processing device according to the first embodiment illustrated in FIG. 3.

FIGS. 3 and 4 are flow charts illustrating an operation flow at the time of a change of processing step in the plasma processing device according to the first embodiment illustrated in FIG. 1. The flow charts illustrate operations in which the controller 207 changes output setting of at least one of the source power supply 203 and the bias power supply 205 while continuing the pulse output.

A change of processing step is started in step 300 in FIG. 3, and a shift to step 301 is conducted. In step 301 in FIG. 3, the controller 207 compares the output intensity in the current processing step with the output intensity in next processing step scheduled to be executed.

If it is determined that the output intensity in the next processing step becomes high, a shift to external trigger pulse setting (step 400) is conducted. If it is determined that the output intensity in the next processing step becomes low, a shift to step 320 is conducted. If it is determined that the output intensity in the next processing step does not change, a shift to the external trigger pulse setting (step 400) is conducted in the same way as the case where the output intensity becomes high. Operation in the external trigger pulse setting in step 400 will be described with reference to FIG. 4.

If the controller 207 determines that the output intensity becomes high in step 301, a shift to step 310 is conducted after the external trigger pulse setting in step 400. The controller 207 adjusts the output intensity to a setting value in the next processing step in step 310 and shifts to step 311. In step 311, it is determined whether the adjusted output is setting intensity. If it is determined that the adjusted output does not have a setting value or the adjustment is not finished, the controller 207 returns to step 310 and conducts adjustment again, and then repeats decision in step 311. If it is determined that the output intensity has a setting value or a value in an allowable range thereof, a shift to an operation of processing step changeover completion in step 330 is conducted.

After the output intensity is adjusted to a setting value in the next processing step by the controller 207 in step 320, a shift to step 321 is conducted. In step 321, it is determined whether the output intensity is adjusted according to the setting in the same way as step 311. If it is determined that the output intensity is not adjusted, a shift to step 320 is conducted, adjusted again, and then the processing is repeated until it is determined in step 321 that the output intensity is adjusted.

If it is determined that the output intensity has a setting value or a value in an allowable range thereof, the controller 207 shifts to a flow of the external trigger pulse setting in step 400 and executes the flow. In addition, after the operation flow of the external trigger pulse setting illustrated in FIG. 4 is finished, the controller 207 shifts to step 330 and finishes the change of the processing step.

If it is determined in step 301 that the output intensity does not change or a value after the change stays in a predetermined range of the original intensity, the controller 207 shifts to step 400 and conducts the external trigger pulse setting, then shifts to step 330 and finishes the change of processing step.

FIG. 4 illustrates a flow of operation of the external trigger pulse setting illustrated in FIG. 3. FIG. 4 is a flow chart illustrating the flow of operation of the external trigger pulse setting in the plasma processing device according to the first embodiment illustrated in FIG. 3.

In the operation of the external trigger pulse setting illustrated in FIG. 4, the duty ratio and the frequency of the high frequency power in a former step included in two processing steps are changed to those in a latter step. First, in step 401, the controller 207 compares the duty ratio in the current or former processing step with the duty ratio in the next processing step. If it is determined that the duty ratio becomes high in the next processing step, the external trigger pulse setting shifts to step 410. If it is determined that the duty ratio becomes low in the next processing step, the external trigger pulse setting shifts to step 420. If it is determined that the duty ratio does not change in the next processing step, the external trigger pulse setting shifts to step 430.

In step 410, the controller 207 reads out information of the recipe, and adjusts the pulse frequency to a setting value in the next processing step indicated in the information. Then, in step 411, the controller 207 determines whether the pulse frequency is adjusted according to the information in the recipe.

If it is determined that the pulse frequency is not adjusted, the controller 207 returns to step 410 and adjusts the pulse frequency again and then determines in step 411 whether the pulse frequency is adjusted. The controller 207 repeats the operation until it is determined that the pulse frequency is adjusted. If the controller 207 determines that the pulse frequency is adjusted, in step 412 the controller 207 adjusts the duty ratio to a setting value in the next processing step on the basis of information of recipe read out.

Then, in step 413, the controller 207 determines whether the duty ratio is adjusted according to the information in the recipe. If it is determined that the duty ratio is not adjusted, the controller 207 returns to step 412 and adjusts the duty ratio again and then determines in step 413 whether the duty ratio is adjusted. The controller 207 repeats the operation until it is determined that the duty ratio is adjusted. If the controller 207 determines that the duty ratio is adjusted, the controller 207 finishes the external trigger pulse setting 400, returns to the flow in FIG. 3, and shifts to predetermined next step.

In step 420, the controller 207 adjusts the duty ratio to a setting value in the next processing step. In step 421, the controller 207 determines whether the duty ratio is adjusted according to the information in the recipe.

If it is determined that the duty ratio is not adjusted, the controller 207 returns to step 420 and adjusts the duty ratio again and then determines in step 421 whether the duty ratio is adjusted. The controller 207 repeats the operation until it is determined that the duty ratio is adjusted. If the controller 207 determines that the duty ratio is adjusted, the controller 207 shifts to step 422.

In step 422, the pulse frequency is adjusted to a setting value in the next processing step. In step 423, the controller 207 determines whether the pulse frequency is adjusted according to a setting value in the information in the recipe.

If it is determined that the pulse frequency is not adjusted, the controller 207 returns to step 422 and adjusts the pulse frequency again and then determines in step 423 whether the pulse frequency is adjusted. The controller 207 repeats the operation until it is determined that the pulse frequency is adjusted. If the controller 207 determines that the pulse frequency is adjusted, the controller 207 finishes the external trigger pulse setting 400, returns to the flow in FIG. 3, and shifts to predetermined next step.

In step 430, the pulse frequency is adjusted to a setting value in the next processing step. In step 431, the controller 207 determines whether the pulse frequency is adjusted according to a setting value of information in the recipe.

If it is determined that the pulse frequency is not adjusted, the controller 207 returns to step 430, adjusts the pulse frequency again, and then determines in step 431 whether the pulse frequency is adjusted. The controller repeats the operation until it is determined that the pulse frequency is adjusted. If it is determined that the pulse frequency is adjusted, the controller 207 finishes the external trigger pulse setting 400, returns to the flow in FIG. 3, and shifts to predetermined next step.

As described heretofore, the output intensity and the duty ratio in the current or immediately preceding processing step are compared with the output intensity and the duty ratio in the next processing step. Various parameters are gradually set according to the flow chart. As a result, adjustment is conducted to prevent the high frequency power supply from outputting with longer and higher output intensity than the setting value. Here, as for various parameters, the setting value is changed successively by the controller 207 according to the flow chart.

In the above-described embodiment, operation of the controller 207 has been described. However, the source power supply 203 or the bias power supply 205 may compare the output intensity and the duty ratio in two processing steps, i.e., a former step and a latter step, and change output setting in accordance with the flow charts in FIGS. 3 and 4.

FIG. 5 is a table illustrating case division in setting change of the output of the power supply at the time of a shift between two processing steps respectively conducted before and after the shift in the plasma processing device according to the first embodiment illustrated in FIG. 1. Output parameters in the former processing step are compared with output parameters in the next processing step, and case division is conducted according to whether three parameters, i.e., the output intensity, the duty ratio, and the pulse frequency become high or become low.

As regards eight cases 600 to 1300 in the table illustrated in FIG. 5, propriety of the flow charts in FIGS. 3 and 4 will now be described. FIGS. 6 to 13 are tables schematically illustrating changes of the power supply output in each case where parameters of the high frequency power are changed over at the time of a shift of processing step according to the first embodiment illustrated in FIG. 1. With reference to each of FIGS. 6 to 13, an ideal changeover of processing step in which the output intensity, the duty ratio, and the pulse frequency change over at the same time, a case where output is conducted with output intensity that is longer and higher than the setting value, and a case where changeover of processing step is conducted according to the flow chart illustrated in FIGS. 3 and 4 will be described.

The case 600 in FIG. 6 is a table illustrating output changes of the power supply in a case where all of the output intensity, the duty ratio, and the pulse frequency become high in the case 600 illustrated in FIG. 5. Reference numeral 601 illustrates an ideal changeover of processing step. Reference numeral 607 illustrates a case where each setting value is changed over in accordance with the flow charts in FIGS. 3 and 4. Reference numerals 602 to 606 illustrate cases where setting values are changed over in other sequences.

Comparing changeover of processing step in 602 to 606 with changeover of processing step in 607, a period for which output is conducted with higher output intensity becomes long even in a shift of processing step in 602, 603, 604, and 606 as compared with 607. Especially in 602 and 604, output is conducted with output intensity that is long and high as compared with a setting value after the shift of processing step. In 605, a period for which output is conducted with high output intensity does not change from 607. However, a period for which output is conducted with low output intensity becomes long.

With respect to cases illustrated in FIG. 7 to FIG. 13 as well, study similar to that for the case 600 in FIG. 6 is conducted. In any case study results, it is found that the output intensity becomes low and the output period becomes short in the case where the setting values are changed over in accordance with the flow charts in FIGS. 3 and 4.

As a result, it is found that control can be exercised to prevent the high frequency power supply from outputting with output intensity of setting value or more by conducting shifts of processing step in accordance with the flow charts in FIGS. 3 and 4. As a result, it is possible to provide etching processing conditions that deter generation of plasma having a high electron temperature and a high degree of dissociation and that do not damage the semiconductor wafer.

In the above-described embodiment, both the source power supply 203 and the bias power supply 205 have a configuration that outputs pulse-shaped high frequency power. However, the present invention is not restricted to this. In a case where at least one of the power supplies outputs power in a pulse form, the present invention is capable of bringing about similar actions and effects by executing output changes of power at the time of shifts of the processing step in the power supply.

Second Embodiment

In the first embodiment, an example in which control is exercised to successively change over the duty ratio and the pulse frequency of output of high frequency power from the source power supply 203 or the bias power supply 205 in the external trigger pulse setting in step 400 has been described. However, it is also possible to configure the pulse generator 208 to be capable of changing over the duty ratio and the pulse frequency in parallel. Especially in a case where the pulse generator 208 is provided as a portion of a device for arithmetic operation of a microcomputer or the like including an arithmetic operation device, a storage device, and an interface to a communication means, it is in general possible to conduct changeover of the external trigger pulse signal in a short time of approximately one tenth as compared with output control executed in each of the source power supply 203 and the bias power supply 205.

In the following embodiment, an example in which a changeover sequence of setting of the output intensity having a large time constant and setting of the external trigger pulse signal having a small time constant is controlled will be described hereafter with reference to FIGS. 2 and 3 and FIG. 14.

The plasma processing device according to the present embodiment is similar to the device described in the first embodiment. FIG. 3 and FIG. 14 are flow charts at the time of processing step changeover according to the second embodiment of the present invention. FIG. 14 is a flow chart illustrating a flow of operation of external trigger pulse setting at the time of a shift of processing step in the plasma processing device according to the second embodiment of the present invention.

A flow of operation of changing the setting of various parameters of the output from the power supply illustrated in FIG. 3 is similar to that in the first embodiment. However, the external trigger pulse setting in the second embodiment is executed in the output control pulse generator 208 for each power supply provided in each power supply of the source power supply 203 or the bias power supply 205 or disposed within the controller 207 connected to the power supply to be able to communicate therewith, along not the step 400, but the external trigger pulse setting illustrated as step 1400 in FIG. 14.

Figure 14:
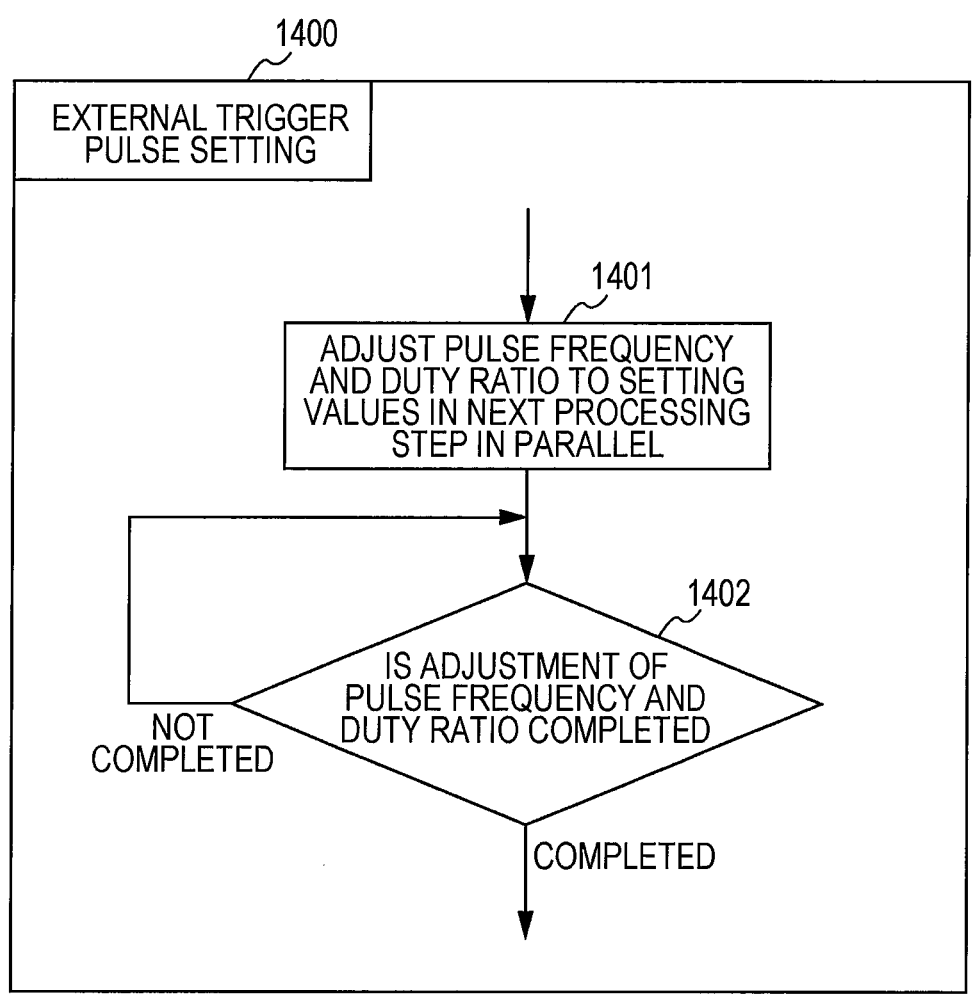
FIG. 14 is a flow chart illustrating a flow of operation of external trigger pulse setting at the time when a shift of processing step is conducted in a plasma processing device according to a second embodiment of the present invention.

In the external trigger pulse setting (step 1400) in FIG. 14, first in step 1401, the controller 207 including pulse generators 208 corresponding to respective power supplies adjusts the pulse frequency and the duty ratio of high frequency power from the source power supply 203 or the bias power supply 205 to setting values under processing conditions in the next processing step, in parallel. Then, in step 1402, the controller 207 having the pulse generators 208 for respective power supplies detects and determines whether the pulse frequency and the duty ratio are adjusted according to the above-described setting. If the controller determines that the pulse frequency and the duty ratio are not adjusted, the external trigger pulse setting 1400 returns to step 1401, conducts the adjustment again, and then determines in step 1402 whether the pulse frequency and the duty ratio are adjusted. The operation is repeated until it is determined that the pulse frequency and the duty ratio are adjusted to the setting values or become values within an allowable range. Then, the controller 207 finishes the external trigger pulse setting 1400 and returns to the flow in FIG. 3.

Control can be exercised to prevent the high frequency power supply from outputting with output intensity that is longer and higher than the setting value by successively setting the output intensity and the external trigger pulse setting in accordance with the flow charts in FIG. 3 and FIG. 14 as described heretofore. Furthermore, in the case study results illustrated in FIGS. 6 to 13 in the first embodiment, adjustments of the pulse frequency and the duty ratio are conducted continuously in the suitable changeover sequence. In the flow charts in the second embodiment in which the pulse frequency and the duty ratio are adjusted in parallel as well, therefore, output setting can be changed over in a suitable sequence.

What is claimed is:

1. A plasma processing method including disposing a wafer to be processed on a sample stage disposed in a processing chamber within a vacuum vessel, supplying an electric field using first high frequency power for plasma generating, and supplying second high frequency power for bias potential generating above an electrode disposed within the sample stage and processing a film on a top surface of the wafer,
    wherein at least one of the first high frequency power and the second high frequency power is supplied in a plurality of pulses repeatedly with predetermined amplitudes, predetermined duty ratios of the pulses of the predetermined amplitudes, and predetermined repetition cycle periods for the pulses of the predetermined amplitudes, and
    wherein the processing of the film includes a step of changing the supply of the at least one of the first high frequency power and the second high frequency power by finally increasing the amplitudes among the repetition cycle periods, the duty ratios and the amplitudes thereof, or first decreasing amplitudes among the repetition cycle periods, the duty ratio, and the amplitudes thereof.

2. The plasma processing method according to claim 1, wherein
    in the step, one of the repetition cycle periods and the duty ratio of the at least one of the first high frequency power and the second high frequency power is decreased before the other one of the repetition periods and the duty ratio thereof is increased.

3. The plasma processing method according to claim 1, wherein
    in the step, the repetition cycle periods of the at least one of the first high frequency power and the second high frequency power are increased before the duty ratios thereof are increased.

4. The plasma processing method according to claim 1, wherein
    in the step, the duty ratio of the at least one of the first high frequency power and the second high frequency power are decreased before the repetition cycle periods are decreased.

* * * * *